US010680050B2

(12) United States Patent
Tsai et al.

(10) Patent No.: US 10,680,050 B2
(45) Date of Patent: Jun. 9, 2020

(54) DISPLAY DEVICE

(71) Applicant: InnoLux Corporation, Miao-Li County (TW)

(72) Inventors: Tsung-Han Tsai, Miao-Li County (TW); Kuan-Feng Lee, Miao-Li County (TW); Yu-Hsien Wu, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/372,612

(22) Filed: Apr. 2, 2019

(65) Prior Publication Data

US 2019/0229170 A1    Jul. 25, 2019

Related U.S. Application Data

(63) Continuation of application No. 16/174,939, filed on Oct. 30, 2018, now Pat. No. 10,292,235, which is a
(Continued)

(51) Int. Cl.
*H01L 27/32* (2006.01)
*H05B 33/22* (2006.01)
(Continued)

(52) U.S. Cl.
CPC ...... *H01L 27/3262* (2013.01); *G02F 1/13454* (2013.01); *G09G 3/32* (2013.01); *H01L 25/0753* (2013.01); *H01L 27/088* (2013.01); *H01L 27/3258* (2013.01); *H01L 27/3288* (2013.01); *H01L 33/00* (2013.01); *H01L 33/22* (2013.01);
(Continued)

(58) Field of Classification Search
CPC ... H05B 33/22; H01L 25/0753; H01L 27/088; H01L 27/3258; H01L 51/5206; H01L 51/5268; G02F 1/13454
See application file for complete search history.

(56) References Cited

U.S. PATENT DOCUMENTS 7,223,146 B2  5/2007  Nishikawa
9,324,962 B2  4/2016  Kim
(Continued)

FOREIGN PATENT DOCUMENTS

CN        1444426 A     9/2003
CN     106684094 A      5/2017
EP     2 980 870 A1     2/2016

OTHER PUBLICATIONS

European office action dated Oct. 9, 2019, issued in application No. EP 18 174 710.6.
(Continued)

*Primary Examiner* — Anne M Hines
(74) *Attorney, Agent, or Firm* — McClure, Qualey & Rodack, LLP

(57) ABSTRACT

A display device is provided. The display device includes a substrate and an insulating layer disposed on the substrate and having a recess. The display device also includes an organic layer disposed on the insulating layer. The display device also includes at least one light emitting unit disposed in the recess and a conductive layer disposed on the light emitting unit.

16 Claims, 12 Drawing Sheets

Related U.S. Application Data continuation of application No. 16/003,246, filed on Jun. 8, 2018, now Pat. No. 10,149,366, which is a continuation of application No. 15/794,153, filed on Oct. 26, 2017, now Pat. No. 10,021,762.

(60) Provisional application No. 62/527,198, filed on Jun. 30, 2017.

(51) Int. Cl.
| | | |
|---|---|---|
| *H01L 25/075* | (2006.01) | |
| *G09G 3/32* | (2016.01) | |
| *H01L 27/088* | (2006.01) | |
| *G02F 1/1345* | (2006.01) | |
| *H01L 51/52* | (2006.01) | |
| *H01L 51/00* | (2006.01) | |
| *H01L 51/56* | (2006.01) | |
| *H01L 33/00* | (2010.01) | |
| *H01L 33/22* | (2010.01) | |
| *H01L 21/02* | (2006.01) | |
| *H01L 33/38* | (2010.01) | |
| *H01L 33/62* | (2010.01) | |
| *H01L 27/15* | (2006.01) | |

(52) U.S. Cl.
CPC ...... *H01L 51/0097* (2013.01); *H01L 51/5206* (2013.01); *H01L 51/5268* (2013.01); *H01L 51/56* (2013.01); *H05B 33/22* (2013.01); *G02F 1/13452* (2013.01); *G09G 2300/0426* (2013.01); *H01L 21/02381* (2013.01); *H01L 27/156* (2013.01); *H01L 27/3244* (2013.01); *H01L 33/38* (2013.01); *H01L 33/62* (2013.01); *H01L 2224/04026* (2013.01); *H01L 2227/323* (2013.01); *H01L 2251/5338* (2013.01); *H01L 2251/558* (2013.01); *H01L 2924/10253* (2013.01); *H01L 2924/12041* (2013.01); *H01L 2933/0091* (2013.01)

(56) References Cited

U.S. PATENT DOCUMENTS

| | | |
|---|---|---|
| 9,673,421 B2 | 6/2017 | Sun |
| 2004/0017153 A1 | 1/2004 | Nishikawa |
| 2007/0295973 A1 | 12/2007 | Jinbo et al. |
| 2012/0286299 A1 | 11/2012 | Lee et al. |
| 2016/0268537 A1 | 9/2016 | Ma |
| 2016/0365360 A1 | 12/2016 | Li et al. |
| 2017/0062679 A1 | 3/2017 | Lee et al. |
| 2017/0263896 A1* | 9/2017 | Inoue .................. H05B 33/24 |

OTHER PUBLICATIONS

Chinese language office action dated Mar. 20, 2020, issued in application No. CN 201810510202.9.

* cited by examiner

DISPLAY DEVICE

CROSS REFERENCE TO RELATED APPLICATIONS

This Application is a Continuation of pending U.S. patent application Ser. No. 16/174,939, filed Oct. 30, 2018, which is a Continuation of pending U.S. Pat. No. 10,149,366, which is Continuation of U.S. Pat. No. 10,021,762, which claims the benefit of U.S. Provisional Application No. 62/527,198 filed on Jun. 30, 2017, the entirety of which is incorporated by reference herein.

BACKGROUND

Field of the Disclosure

The disclosure relates to display technology, and in particular to a display device using micro light-emitting devices (LEDs).

Description of the Related Art

Display devices (e.g., liquid-crystal displays (LCDs), active matrix organic light-emitting displays (AMOLEDs)) are widely employed in electronic products, such as notebook computers, personal digital assistants (PDAs), electronic books, projectors, and mobile phones.

Display panels including display devices typically employ one or more light source elements in a pixel region. Recently, LEDs are increasingly being considered as a light source element for use in display devices. An LED converts electric energy into light and typically includes a quantum well structure that acts as an emissive layer sandwiched between two oppositely doped semiconductor layers. As semiconductor materials for the LED have improved, many new LEDs can be more efficient to covert electric energy into light.

An LED display panel uses an array of light-emitting diodes integrated with a thin-film transistor (TFT) array substrate to form pixels (or sub-pixels) for the display. Because of the self-illumination properties of the LEDs, the backlight module can be omitted. As a result, the LED display panel can be thinner and lighter, and competitive advantages can be obtained.

Compared to organic LED (OLED) display devices, LED display devices are more stable and have a longer lifespan, higher brightness, and shorter response time. Thus, LED displays have gradually been adopted in many mainstream next-generation display products.

Although existing display devices using LEDs as light-source elements have been adequate for their intended purposes, they have not been entirely satisfactory in all respects. Therefore, there are still some problems that remain to be overcome in manufacturing display devices.

SUMMARY

An exemplary embodiment of a display device is provided. The display device includes a substrate, a driving circuit disposed on the substrate, a first conductive layer disposed on the driving circuit, at least one of light emitting units disposed on the first conductive layer and electrically connected to the driving circuit, and a second conductive layer disposed on at least one of the light emitting units. The second conductive layer has a first surface corresponding to at least one of the light emitting units and a second surface corresponding to a region outside of the first conductive layer. A roughness of the first surface is greater than a roughness of at least a part of the second surface.

Another exemplary embodiment of a display device is provided. The display device includes a substrate, a driving circuit disposed on the substrate, a first conductive layer disposed on the driving circuit, and at least one of light emitting units disposed on the first conductive layer and electrically connected to the driving circuit. Each of the light emitting units includes a first semiconductor layer disposed on the first conductive layer and a second semiconductor layer disposed on the first semiconductor layer. The first semiconductor layer has a first surface adjacent to the first conductive layer and the second semiconductor layer has a second surface farthest from the first conductive layer. A roughness of the second surface is greater than a roughness of the first surface.

Yet another exemplary embodiment of a display device is provided. The display device includes a substrate, a driving circuit disposed on the substrate, a first conductive layer disposed on the driving circuit, and at least one of light emitting units disposed on the first conductive layer and electrically connected to the driving circuit. Each of the light emitting units includes a first electrode disposed on the first conductive layer, a first semiconductor layer disposed on the first electrode, a second semiconductor layer disposed on the first semiconductor layer, and a second electrode disposed on the second semiconductor layer. The first electrode has a first surface adjacent to the first conductive layer and the second electrode has a second surface farthest from the first conductive layer. A roughness of the second surface is greater than a roughness of the first surface.

BRIEF DESCRIPTION OF THE DRAWINGS

The present disclosure can be further understood by reading the subsequent detailed description and examples with references made to the accompanying drawings, wherein:

FIG. 2-1 is a cross section along 2-2' line shown in FIG. 1.

FIG. 2-2 is a cross section of a display device according to some embodiments of the present disclosure.

FIG. 4-1 is a cross section of a display device according to some embodiments of the present disclosure.

FIG. 4-2 is a cross section of a display device according to some embodiments of the present disclosure.

FIG. 4-3 is a cross section of a display device according to some embodiments of the present disclosure.

FIG. 4-4 is a cross section of a display device according to some embodiments of the present disclosure.

FIG. 5-1 is a cross section of a display device according to some embodiments of the present disclosure.

FIG. 5-2 is a cross section of a display device according to some embodiments of the present disclosure.

FIG. 6-1 is a cross section of a display device according to some embodiments of the present disclosure.

FIG. 6-2 is a cross section of a display device according to some embodiments of the present disclosure.

DETAILED DESCRIPTION

Figure 1:
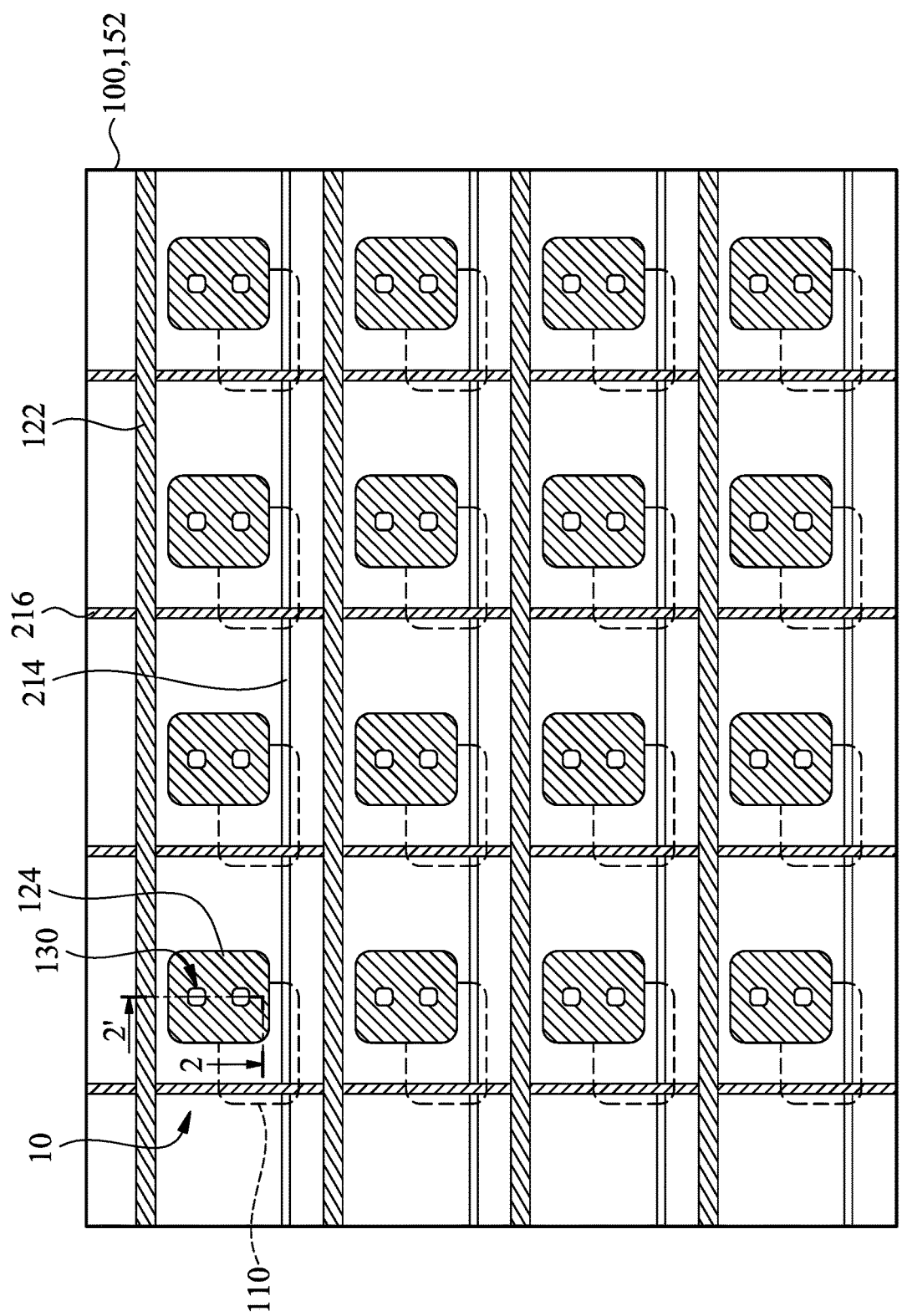
FIG. 1 is a plan view of a display panel with display devices arranged in an array according to some embodiments of the present disclosure.

The following description is of the best-contemplated mode of carrying out the invention. This description is provided for the purpose of illustrating the general principles of the invention and should not be taken in a limiting sense. The scope of the invention is best determined by reference to the appended claims. Moreover, the same or similar elements in the drawings and the description are labeled with the same reference numbers.

Figures 1, 2:
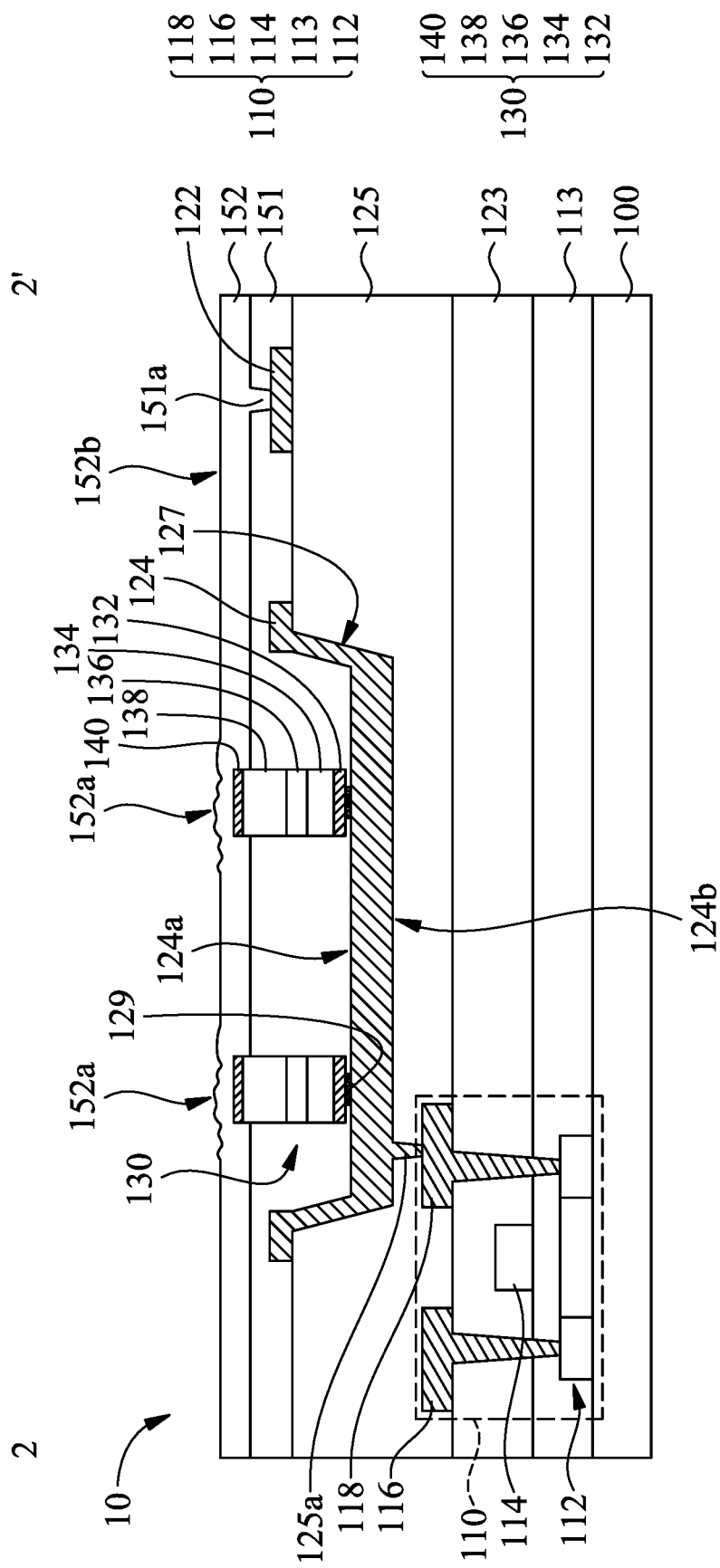
Figure 2:
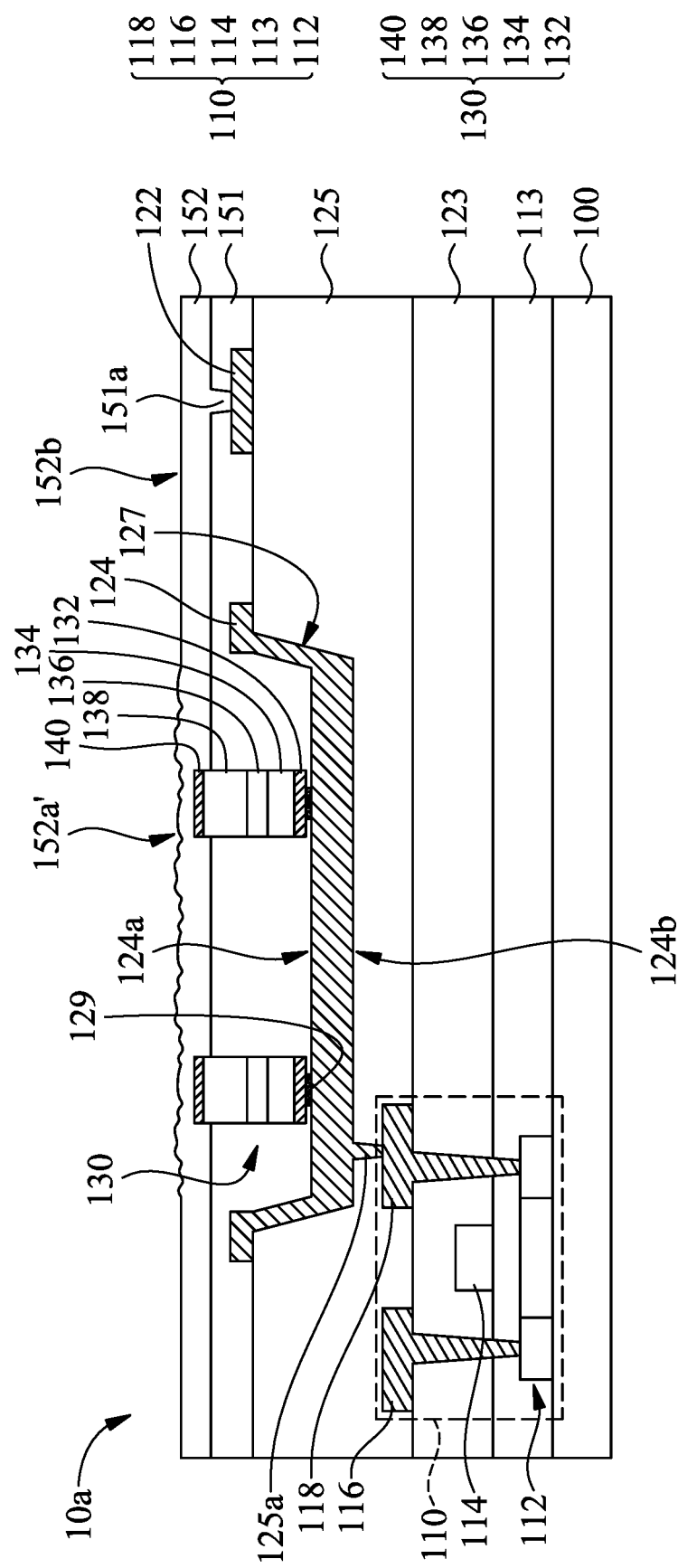

Refer to FIGS. 1 and 2-1, in which FIG. 1 is a plan view of a display panel with display devices 10 arranged in an array according to some embodiments of the present disclosure and FIG. 2-1 is a cross section along 2-2' line shown in FIG. 1. In some embodiments, the display device 10 may be implemented in a micro LED-based display device. In some embodiments, the display device 10 includes a substrate 100 that is comprised of, for example, glass, quartz, plastic, fiber, rubber, or another transparent material. In some embodiments, the substrate 100 could comprise metal foil, or another non-transparent material.

As shown in FIG. 2-1, in some embodiments, the display device 10 further includes a driving circuit 110 disposed on the substrate 100. In some embodiments, the driving circuit 110 includes a transistor (e.g., thin film transistor) disposed on the substrate 100. For example the transistor may serve as a driving element used in the display region or the peripheral region.

In those cases, the driving circuit 110 includes an active layer 112, a gate dielectric layer 113, a gate electrode 114, a source electrode 116, and a drain electrode 118. The active layer 112 is disposed on the substrate 100 and includes a channel region, and source and drain regions on both sides of the channel region. The active layer 112 may be made of amorphous silicon, polysilicon (e.g., low temperature polysilicon, LTPS), metal oxide semiconductor (e.g., indium gallium zinc oxide (IGZO), indium zinc oxide (IZO), indium gallium oxide (IGO), indium tin zinc oxide (ITZO), or the like).

The gate dielectric layer 113 covers the active layer 112 and the substrate 100 and has openings to expose the source and drain regions of the active layer 112. The gate dielectric layer 113 may include inorganic materials such as silicon oxide, silicon nitride, or a combination thereof.

The gate electrode 114 is disposed on the gate dielectric layer 113 and extends from the gate line 214 (shown in FIG. 1), which is also referred to as a scan line. The gate electrode 114 may include a conductive material, examples of which may include but are not limited to copper, aluminum, gold, silver, molybdenum, tungsten, titanium, chromium, an alloy thereof, and other suitable electrode materials.

The source electrode 116 extends from the data line 216 (shown in FIG. 1). Moreover, the source electrode 116 and the drain electrode 118 are disposed over the gate electrode 114 and electrically connected to the source and drain regions of the active layer 112, respectively, via the openings of the gate dielectric layer 113. The source electrode 116 and the drain electrode 118 may include a conductive material, examples of which may include but are not limited to copper, aluminum, gold, silver, molybdenum, tungsten, titanium, chromium, alloys thereof, and other suitable electrode materials. The source electrode 116 and the drain electrode 118 may be a single layer or have a multi-layer structure. For example, the source electrode 116 and the drain electrode 118 are a multi-layer structure of Mo/Al/Mo (molybdenum/aluminum/molybdenum).

In some embodiments, the display device 10 further includes a first insulating layer 123 disposed on the gate dielectric layer 113 and covering the gate electrode 114 to electrically isolate the source electrode 116 and the drain electrode 118 from the gate electrode 114. The first insulating layer 123 may be made of a material that is the same as or similar to that of the gate dielectric layer 113. The source electrode 116 and the drain electrode 118 are disposed on the first insulating layer 123 and pass through the first insulating layer 123 to be electrically connected to the source and drain regions of the active layer 112.

In some embodiments, the display device 10 further includes a second insulating layer 125 having a recess 127 above the driving circuit 110 and disposed on the first insulating layer 123. The second insulating layer 125 serves as a planarization layer and covers the source electrode 116 and the drain electrode 118 and the common line 122. Moreover, the second insulating layer 125 may include an organic insulating material, examples of which may include but are not limited to inorganic materials (such as silicon oxide, silicon nitride, silicon oxynitride, metal oxide) or organic materials (such as polyimide, acrylate, epoxy, poly (methyl methacrylate), benzocyclobutene or polyester).

In some embodiments, the display device 10 further includes a first conductive layer 124 conformally disposed in the recess 127. In some embodiments, the first conductive layer 124 may serve as a reflective layer and may be made of a metal, examples of which may include but are not limited to aluminum, titanium, silver, gold, molybdenum, copper, or alloy. The first conductive layer 124 has a top surface 124a and a bottom surface 124b and the top surface 124a is opposite to the bottom surface 124b. The bottom surface 124b of the first conductive layer 124 is electrically connected to the drain electrode 118 of the driving circuit 110 via a conductive structure 125a (e.g., conductive plug) in the second insulating layer 125.

In some embodiments, the display device 10 further includes a common line 122 disposed on the second insulating layer 125. The common line 122 may be made of a material that is the same as or similar to that of first conductive layer 124.

In some embodiments, the display device 10 further includes one or more light emitting units 130, such as micro LEDs, disposed on the first conductive layer 124 in the recess 127 of the second insulating layer 125. In an example, the display device 10 includes two light emitting units 130, as shown in FIG. 2-1. However, it should be understood that the number of light emitting units 130 is based on the design demands and is not limited to the embodiment of FIG. 2-1.

At least one of the light emitting units 130 neighbors the top surface 124a of the first conductive layer 124. For example, each of the light emitting units 130 may be mounted onto the top surface 124a of first conductive layer 124 via a bonding layer 129, so that the light emitting units 130 are electrically connected to the driving circuit 110 via the first conductive layer 124 and the conductive structure 125a. The bonding layer 129 is employed to facilitate bonding of the light emitting unit 130 through a bonding mechanism, for example, a eutectic alloy bonding, and may be made of an alloy, examples of which may include but are not limited to indium, tin, gold, silver, molybdenum, or aluminum.

In some embodiments, the light emitting unit 130 includes a first electrode 132 disposed on the first conductive layer 124 via the bonding layer 129, a first semiconductor layer 134 disposed on the first electrode 132, a quantum well structure 136 disposed on the first semiconductor layer 134, a second semiconductor layer 138 disposed on the quantum well structure 136, and a second electrode 140 disposed on the second semiconductor layer 138. In some embodiments, the first electrode 132 and the second electrode 140 serve as an anode and a cathode of the light emitting unit 130. In those cases, the first semiconductor layer 134 and the second semiconductor layer 138 may be a p-type doping layer and an n-type doping layer, respectively. Alternatively, the first semiconductor layer 134 and the second semiconductor layer 138 may be an n-type doping layer and an p-type doping layer, respectively, when the first electrode 132 and the second electrode 140 serve as a cathode and an anode of the light emitting unit 130.

In some embodiments, the display device 10 further includes a third insulating layer 151 disposed on the second insulating layer 125 and filling the recess 127 of the second insulating layer 125, so that the light emitting units 130 is surrounded by the third insulating layer 151 in the recess 127 of the second insulating layer 125. Moreover, the first conductive layer 124 surrounds the third insulating layer 151 in the recess 127 of the second insulating layer 125. Although the light emitting units 130 are surrounded by the third insulating layer 151, the second electrode 140 of each light emitting unit 130 is exposed from the top surface of the third insulating layer 151. The third insulating layer 151 may include an organic insulating material, examples of which may include but are not limited to polyimide, acrylate, epoxy, poly (methyl methacrylate), benzocyclobutene or polyester.

In some embodiments, the display device 10 further includes a second conductive layer 152 disposed on the third insulating layer 151 and at least one of the light emitting units 130. Moreover, the second conductive layer 152 is electrically connected to the common line 122 via a conductive structure 151a (e.g., conductive plug) in the third insulating layer 151, so that the exposed second electrode 140 of the light emitting unit 130 is electrically connected to the common line 122 through the second conductive layer 152 and the conductive structure 151a. The second conductive layer 152 may include a transparent conductive material, examples of which may include but are not limited to indium-zinc-oxide, indium-tin-oxide, indium-galium-zinc-oxide, poly(3,4-ethylene-dioxythiophene), polyethyne, poly (p-phenylene vinylene), polypyrrole, polythiophene, polyaniline, polyphenylene sulfide, or polyacetylene.

In some embodiments, the second conductive layer 152 has a first surface 152a corresponding to at least one of the light emitting units 130. For example, the second conductive layer 152 has a first surface 152a corresponding to each of the light emitting units 130. Moreover, from a top-view perspective, the second conductive layer 152 has a second surface 152b corresponding to a region outside of the first conductive layer 124. In some embodiments, a roughness of the first surface 152a is greater than a roughness of at least a part of the second surface 152b. In some embodiments, the first surface 152a is a rough surface and the second surface 152b is a substantially smooth surface, so that the region of the second conductive layer 152 outside of the first conductive layer 124 from a top-view perspective has a uniform thickness. In those cases, the roughness of the first surface 152a may be greater than or equal to 3 nm and less than or equal to 100 nm. In the present disclosure, the value of the "roughness" is obtained by the ten-point height of irregularities (Rz) which is defined as the average distance between the five highest peaks and the five deepest valleys within the evaluation length.

Refer to FIG. 2-2, in which a cross section of a display device 10a according to some embodiments of the present disclosure is shown. Elements in FIG. 2-2 that are the same as those in FIG. 2-1 are labeled with the same reference numbers as in FIG. 2-1 and may not be described again for brevity. In the embodiment, the structure of the display device 10a is similar to that of the display device 10 shown in FIG. 2-1, and therefore it may have the same advantages as display device 10. Unlike the structure of the display device 10 shown in FIG. 2-1, the second conductive layer 152 of the display device 10a has a first surface 152a' corresponding to the first conductive layer 124 in the recess 127 of the second insulating layer 125, from a top-view perspective. Like the first surface 152a shown in FIG. 2-1, the first surface 152a' is a rough surface. In some embodiments, the roughness of the first surface 152a' may be greater than or equal to 3 nm and less than or equal to 100 nm.

Figure 3:
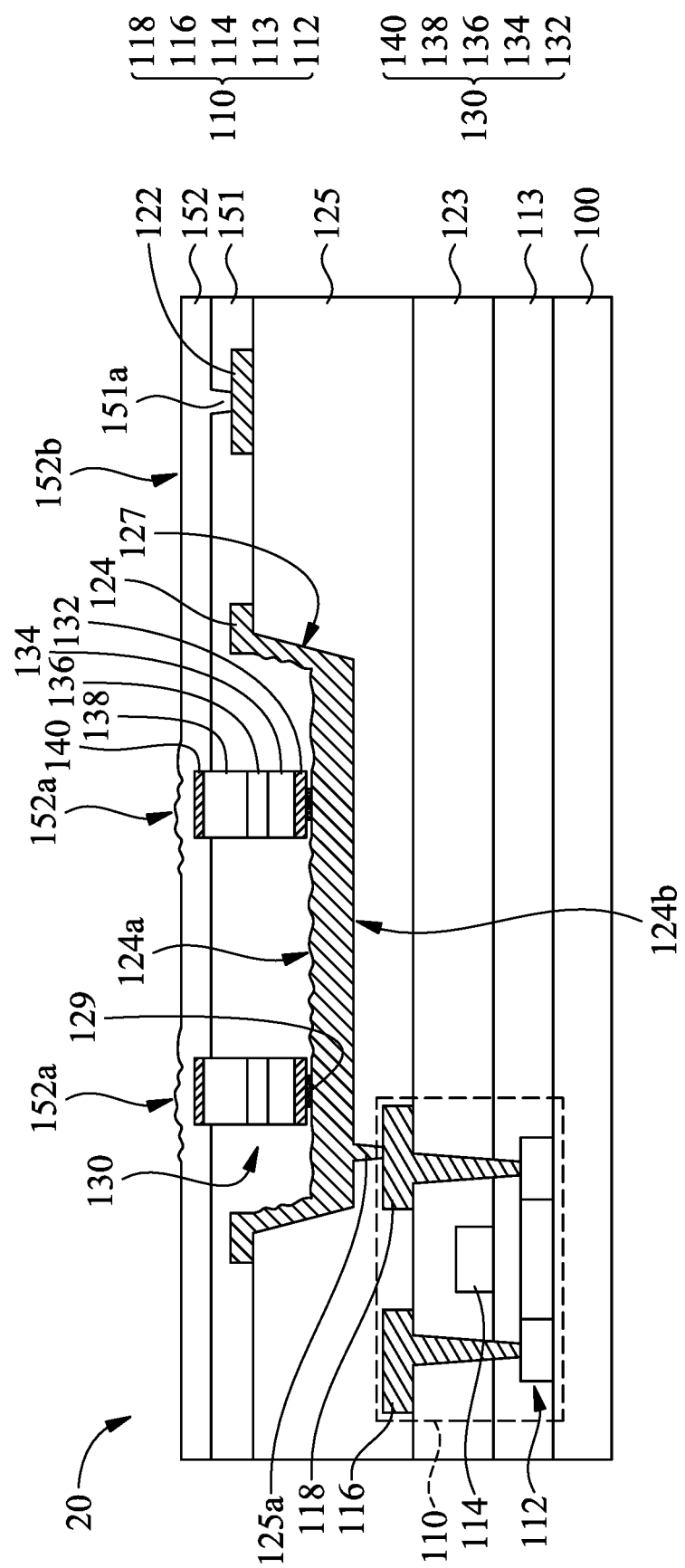
FIG. 3 is a cross section of a display device according to some embodiments of the present disclosure.

Refer to FIG. 3, in which a cross section of a display device 20 according to some embodiments of the present disclosure is shown. Elements in FIG. 3 that are the same as those in FIG. 2-1 are labeled with the same reference numbers as in FIG. 2-1 and may not be described again for brevity. In the embodiment, the structure of the display device 20 is similar to that of the display device 10 shown in FIG. 2-1, and therefore it may have the same advantages as display device 10. Unlike the structure of the display device 10 shown in FIG. 2-1, the top surface 124a of the first conductive layer 124 is a rough surface and a roughness of the top surface 124a is greater than a roughness of at least part of the second surface 152b of the second conductive layer 152. In some embodiments, a portion of the top surface 124a corresponding to the sidewall of the recess 127 of the second insulating layer 125 is substantially smooth.

In some embodiments, similar to the first surface 152a' shown in FIG. 2-2, the first surface 152a of the second conductive layer 152 in the display device 20 may correspond to the first conductive layer 124 in the recess 127 of the second insulating layer 125, from a top-view perspective.

Since the light emitting unit 130 in the display device 20 is disposed between two opposing rough surfaces, the viewing angle performance of the display device 20 can be enhanced further.

Figures 1, 4:
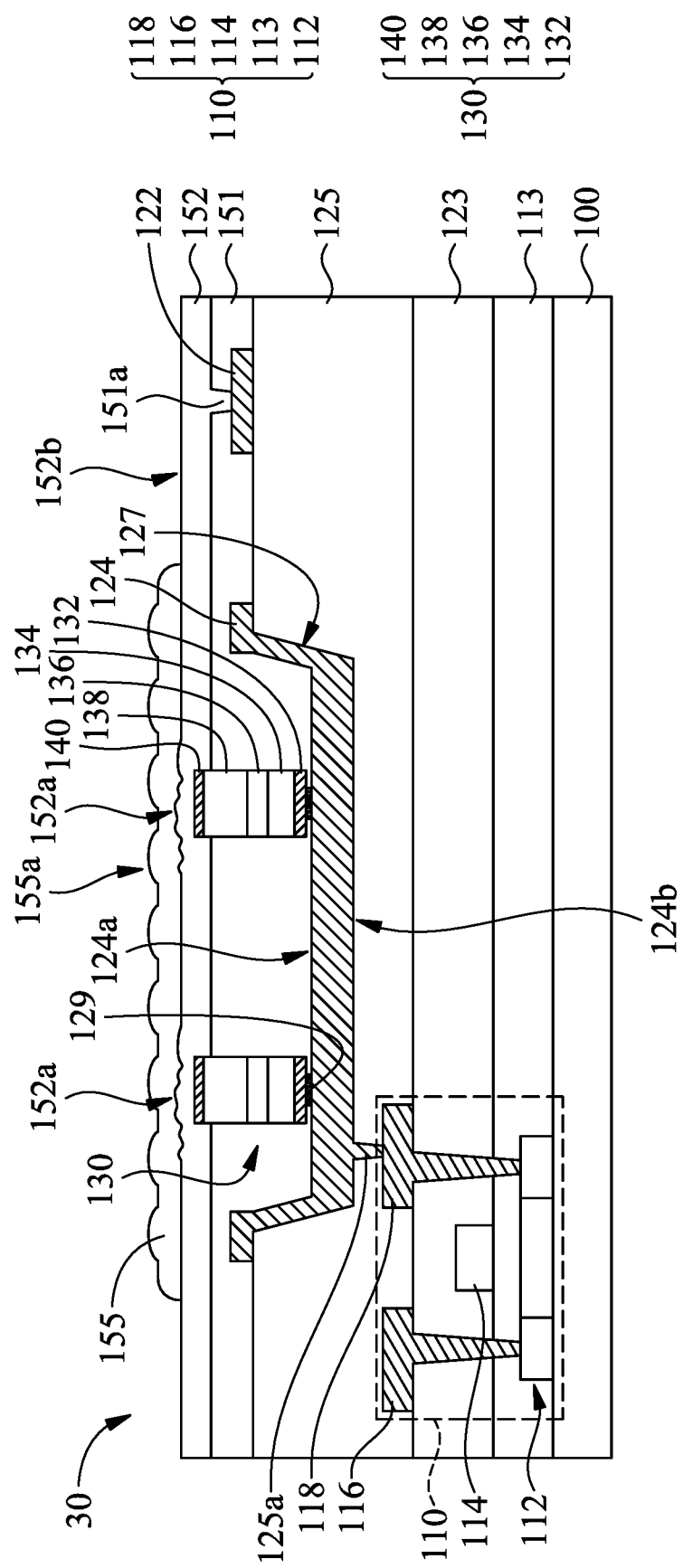
Figures 2, 4:
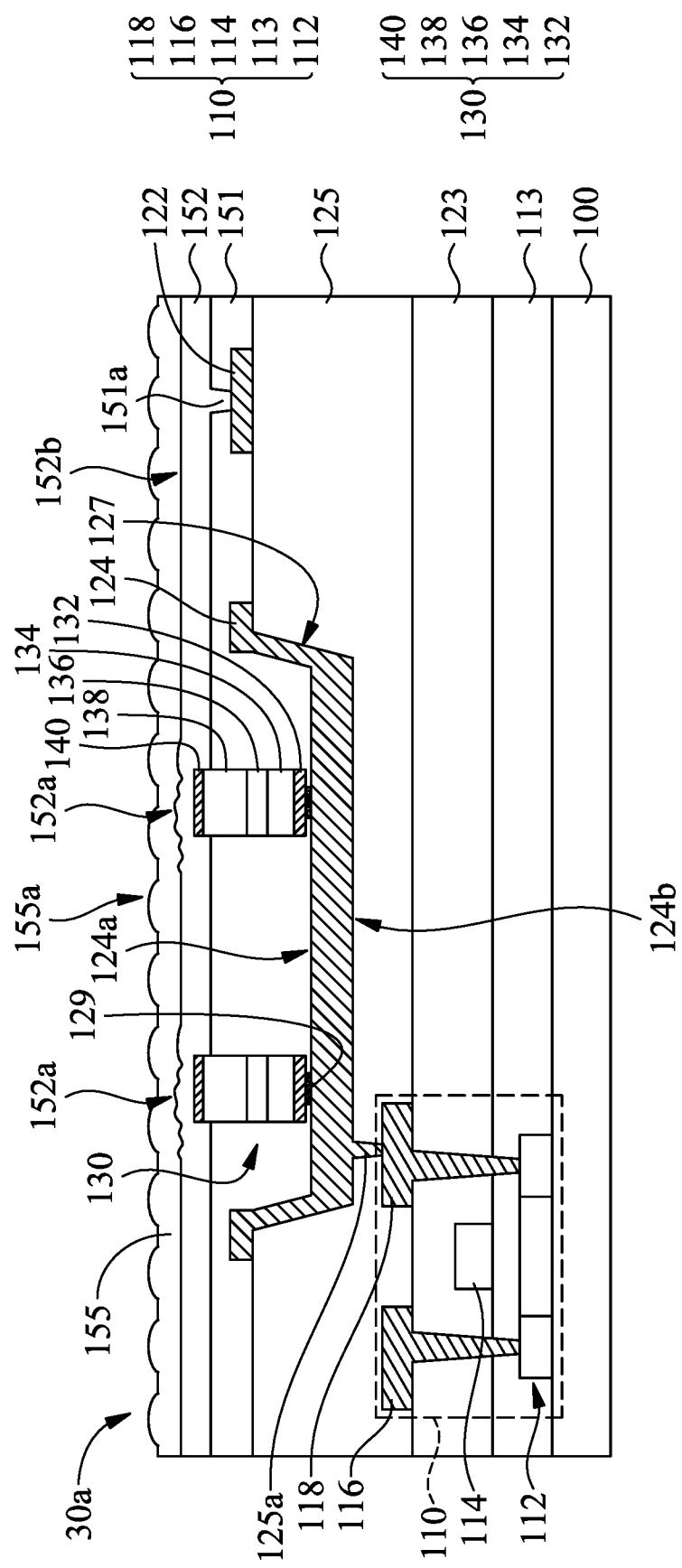
Figures 3, 4:
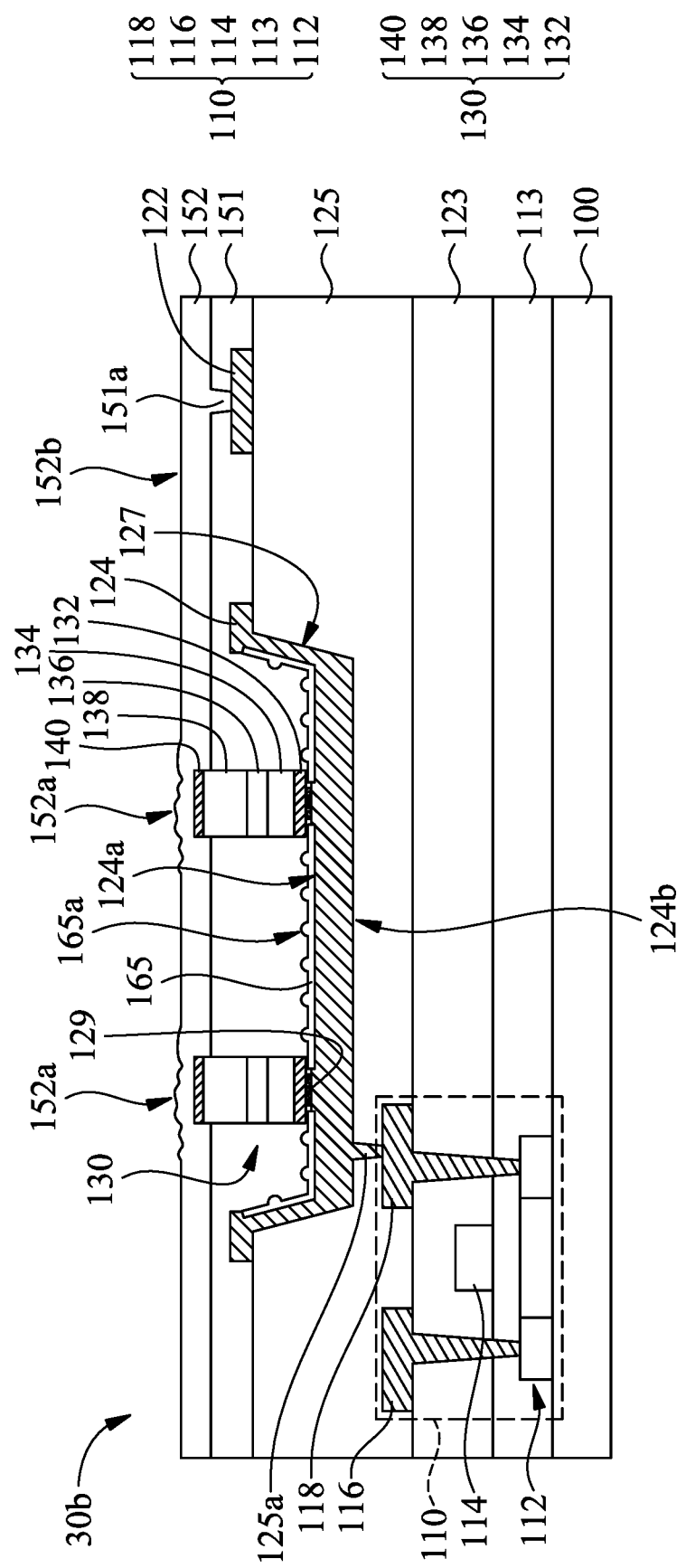
Figure 4:
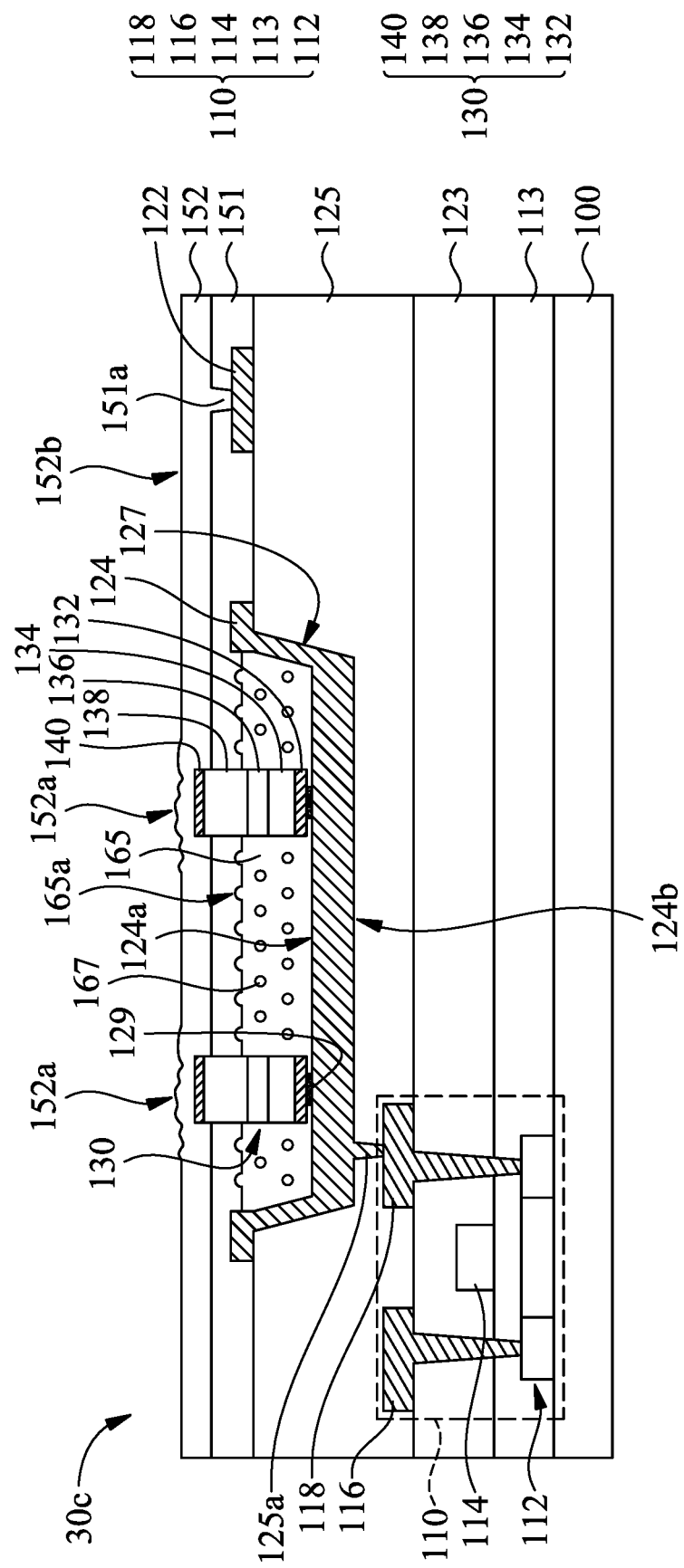

Refer to FIGS. 4-1 and 4-2, in which cross sections of display devices 30 and 30a according to some embodiments of the present disclosure are respectively shown. Elements in FIGS. 4-1 and 4-2 that are the same as those in FIG. 2-1 are labeled with the same reference numbers as in FIG. 2-1 and may not be described again for brevity. The structure of display devices 30 and 30a are similar to that of the display device 10 shown in FIG. 2-1, and therefore they have the same advantages as display device 10. Unlike the structure of the display device 10 shown in FIG. 2-1, the display devices 30 and 30a further include a scattering layer 155 disposed on the second conductive layer 152 on the light emitting units 130. In some embodiments, the scattering layer 155 has a rough surface 155a opposite to the first surface 152a and the second surface 152b of the second conductive layer 152. In some embodiments, the rough surface 155a can be obtained by patterning using lithography and etching processes, ion bombardment, or another suitable patterning method. In some embodiments, the scattering layer 155 partially covers the second conductive layer 152, as shown in the display device 30 of FIG. 4-1. For example, the scattering layer 155 may correspond to the first conductive layer 124 in the recess 127 of the second insulating layer 125, from a top-view perspective. Alternatively, the scattering layer 155 may be extended to cover at least the common line 122, when viewed from a top-view perspective, as shown in the display device 30a of FIG. 4-2. In such cases, the scattering layer 155 may be extended to cover the entirety of the second conductive layer 152. In some embodiments, the scattering layer 155 is made of inorganic materials (such as silicon oxide, silicon nitride, silicon oxynitride, or metal oxide) or organic materials (such as polyimide, acrylate, epoxy, poly(methyl methacrylate), benzocyclobutene or polyester).

In some embodiments, the scattering layer 155 includes scattering particles (not shown) therein. For example, these scattering particles may be transparent particles or quantum dots transparent particles. In some embodiments, the transparent particles are made of silicon oxide, silicon nitride, or metal oxide. In some embodiments, the quantum dot has a core-shell structure. For example, the quantum dot may include a core formed of CdSe, CdTe, CdS, ZnS, ZnSe, ZnO, ZnTe, InAs, InP, or GaP, and a shell formed of ZnS, ZnSe, GaN, or GaP.

In some embodiments, the first conductive layer 124 of the display devices 30 and 30a shown in FIGS. 4-1 and 4-2 may have a top surface that is the same as or similar to that shown in FIG. 3.

Refer to FIG. 4-3, in which a cross section of display devices 30b according to some embodiments of the present disclosure is shown. Elements in FIG. 4-3 that are the same as those in FIG. 2-1 are labeled with the same reference numbers as in FIG. 2-1 and may not be described again for brevity. The structure of the display devices 30b is similar to that of the display device 10 shown in FIG. 2-1, and therefore they have the same advantages as display device 10. Unlike the structure of the display device 10 shown in FIG. 2-1, the display device 30b further includes a scattering layer 165 disposed on the first conductive layer 124 and below the light emitting units 130. In some embodiments, the scattering layer 165 has a rough surface 165a opposite the top surface of the first conductive layer 124. In some embodiments, the rough surface 165a can be obtained by patterning using lithography and etching processes, ion bombardment, or another suitable patterning method. In some embodiments, the first conductive layer 124 on the sidewall of the recess 127 of the second insulating layer 125 is exposed from the scattering layer 165. In some embodiments, the scattering layer 165 is made of a material that is the same as or similar to that of the scattering layer 155 shown in FIG. 4-1 or 4-2.

Refer to FIG. 4-4, in which a cross section of display devices 30c according to some embodiments of the present disclosure is shown. Elements in FIG. 4-4 that are the same as those in FIG. 4-3 are labeled with the same reference numbers as in FIG. 4-3 and may not be described again for brevity. The structure of the display devices 30b is similar to that of the display device 30b shown in FIG. 4-3, and therefore they have the same advantages as display device 30b. Unlike the structure of the display device 30b shown in FIG. 4-3, the scattering layer 165 disposed on the first conductive layer 124 surrounds at least a part of each light emitting unit 130. For example, the recess 127 having the first conductive layer 124 and the light emitting units 130 therein may be fully filled with the scattering layer 165, so that a part of each light emitting unit 130 protruding from the recess 127 is exposed from the scattering layer 165. In some embodiments, the scattering layer 165 includes scattering particles 167 therein, so as to increase the scattering ability of the scattering layer 165, thereby enhancing the viewing angle performance of the display device 30b. For example, the scattering particles 167 may be transparent particles or quantum dots transparent particles. In some embodiments, the transparent particles 167 are made of silicon oxide, silicon nitride, or metal oxide. In some embodiments, the quantum dot has a core-shell structure. For example, the quantum dot may include a core formed of CdSe, CdTe, CdS, ZnS, ZnSe, ZnO, ZnTe, InAs, InP, or GaP, and a shell formed of ZnS, ZnSe, GaN, or GaP.

Figures 1, 5:
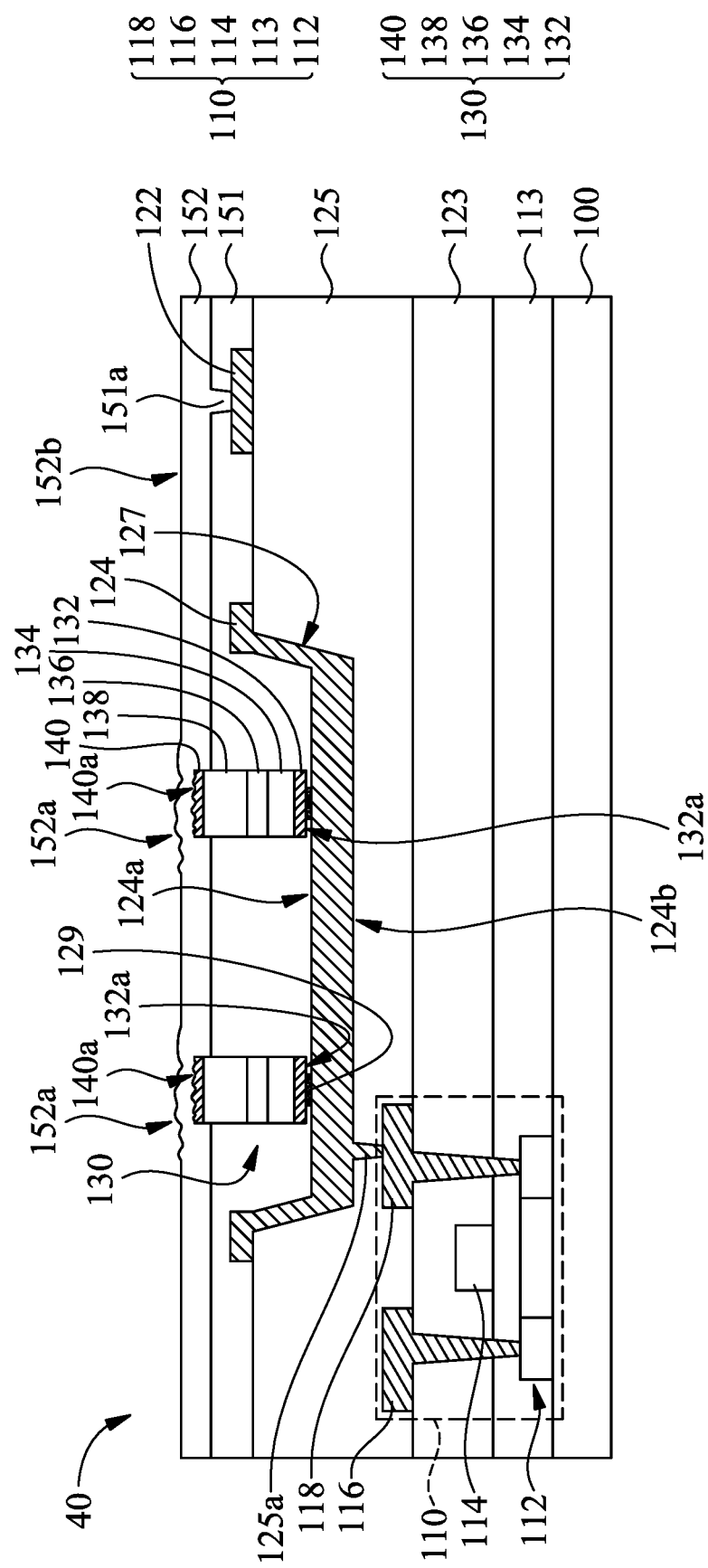
Figures 2, 5:
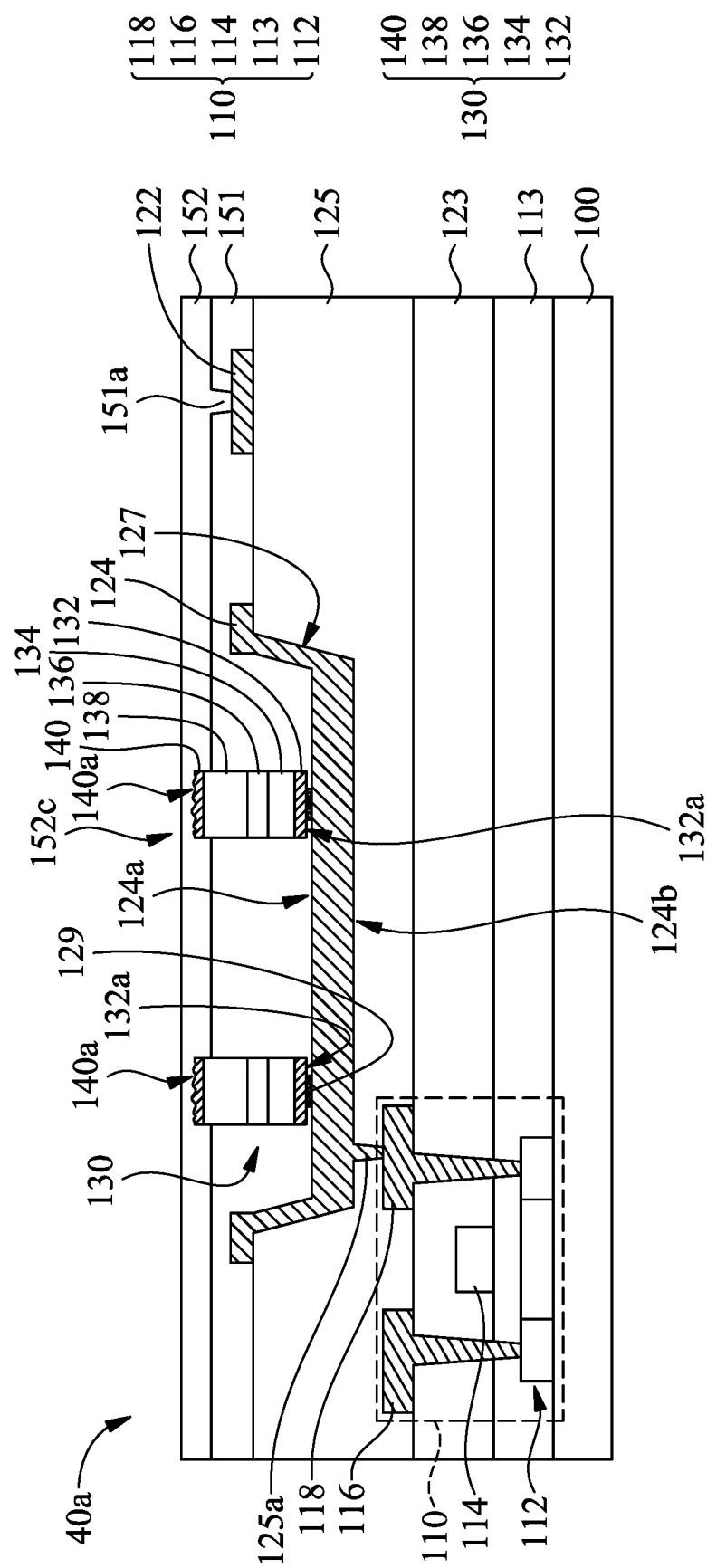

Refer to FIG. 5-1, in which a cross section of a display device 40 according to some embodiments of the present disclosure is shown. Elements in FIG. 5-1 that are the same as those in FIG. 2-1 are labeled with the same reference numbers as in FIG. 2-1 and may not be described again for brevity. In the embodiment, the structure of the display device 40 is similar to that of the display device 10 shown in FIG. 2-1, and therefore it may have the same advantages as display device 10. Unlike the structure of the display device 10 shown in FIG. 2-1, the first electrode 132 of the light emitting unit 130 has a surface 132a that is adjacent to the first conductive layer 124 and that faces the top surface 124a of the first conductive layer 124. Moreover, the second electrode 140 of the light emitting unit 130 has a surface 140a that is adjacent to the second conductive layer 152, opposite to the first surface 152a of the second conductive layer 152, and farthest from the first conductive layer 124. A roughness of the surface 140a is greater than a roughness of the surface 132a. As a result, the first surface 152a of the second conductive layer 152 and the underlying rough surface 140a of the second electrode 140 can increase the viewing angle of light emitted from the light emitting unit 130, thereby enhancing the viewing angle performance of the display device 40.

In some embodiments, the first conductive layer 124 of the display device 40 may have a top surface 124a that is the same as or similar to that shown in FIG. 3.

In some embodiments, similar to the display devices 30, 30a, 30b, and 30c shown in FIGS. 4-1, 4-2, 4-3, and 4-4, respectively, the display device 40 may further include a scattering layer 155 (as shown in FIGS. 4-1 and 4-2) disposed on the second conductive layer 152 on the light emitting units 130 or a scattering layer 165 (as shown in FIG. 4-3 or 4-4) disposed on the first conductive layer 124 and below the light emitting units 130.

Refer to FIG. 5-2, in which a cross section of a display device 40a according to some embodiments of the present disclosure is shown. Elements in FIG. 5-2 that are the same as those in FIG. 5-1 are labeled with the same reference numbers as in FIG. 5-1 and may not be described again for brevity. In the embodiment, the structure of the display device 40a is similar to that of the display device 40 shown in FIG. 5-1, and therefore it may have the same advantages as display device 40. Unlike the structure of the display device 40 shown in FIG. 5-1, the second electrode 140 of each light emitting unit 130 in the display device 40a is covered by a second conductive layer 152 having a substantially smooth surface 152c. Namely, the second conductive layer 152 in the display device 40a does not have the first surface 152a shown in FIG. 5-1.

In some embodiments, the first conductive layer 124 of the display device 40a may have a top surface 124a that is the same as or similar to that shown in FIG. 3.

In some embodiments, the second electrode 140 of each light emitting unit 130 in the display device 40a is covered by a second conductive layer 152 without having the first surface 152a (as shown in FIG. 5-1). In those cases, similar to the display devices 30, 30a, 30b, and 30c shown in FIGS. 4-1, 4-2, 4-3, and 4-4, respectively, the display device 40a may further include a scattering layer 155 (as shown in FIGS. 4-1 and 4-2) disposed on the second conductive layer 152 on the light emitting units 130 or a scattering layer 165 (as shown in FIG. 4-3 or 4-4) disposed on the first conductive layer 124 and below the light emitting units 130.

Figures 1, 6:
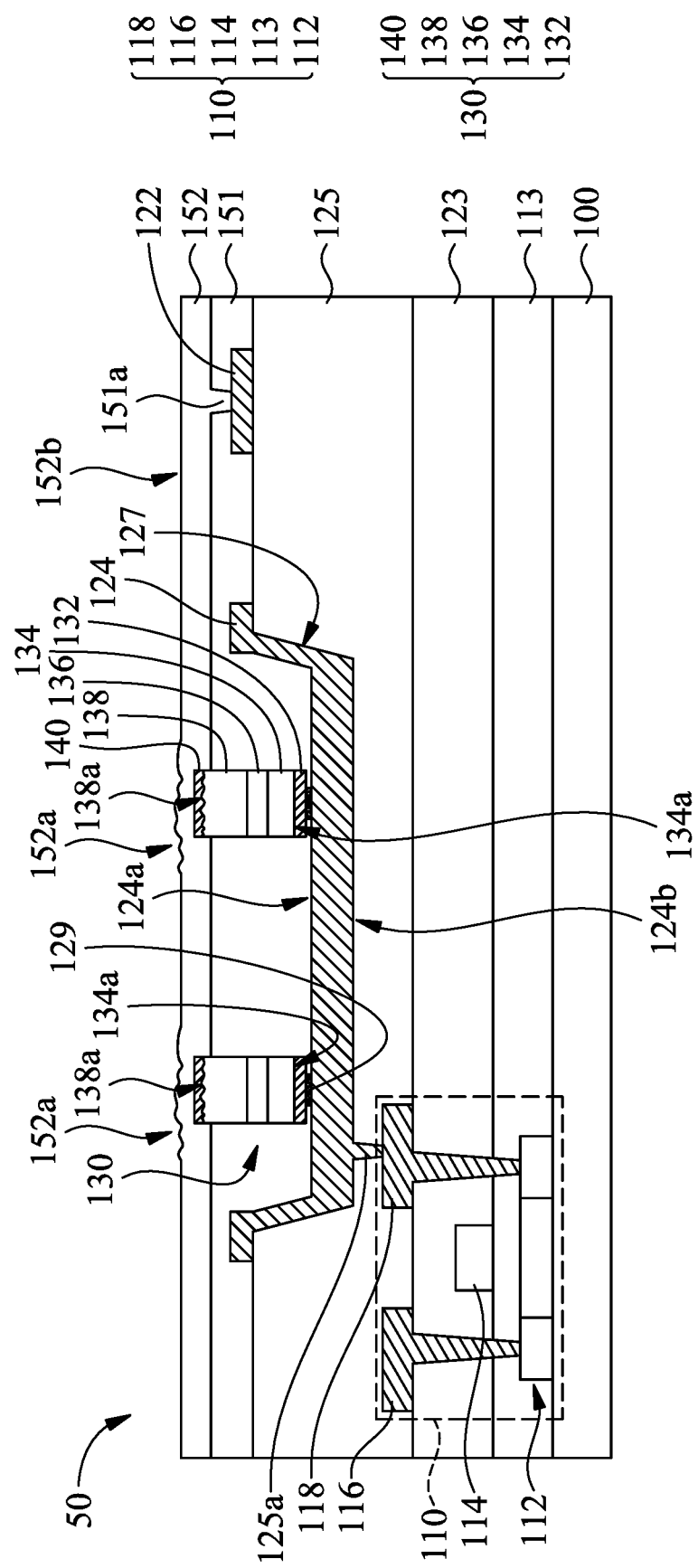
Figures 2, 6:
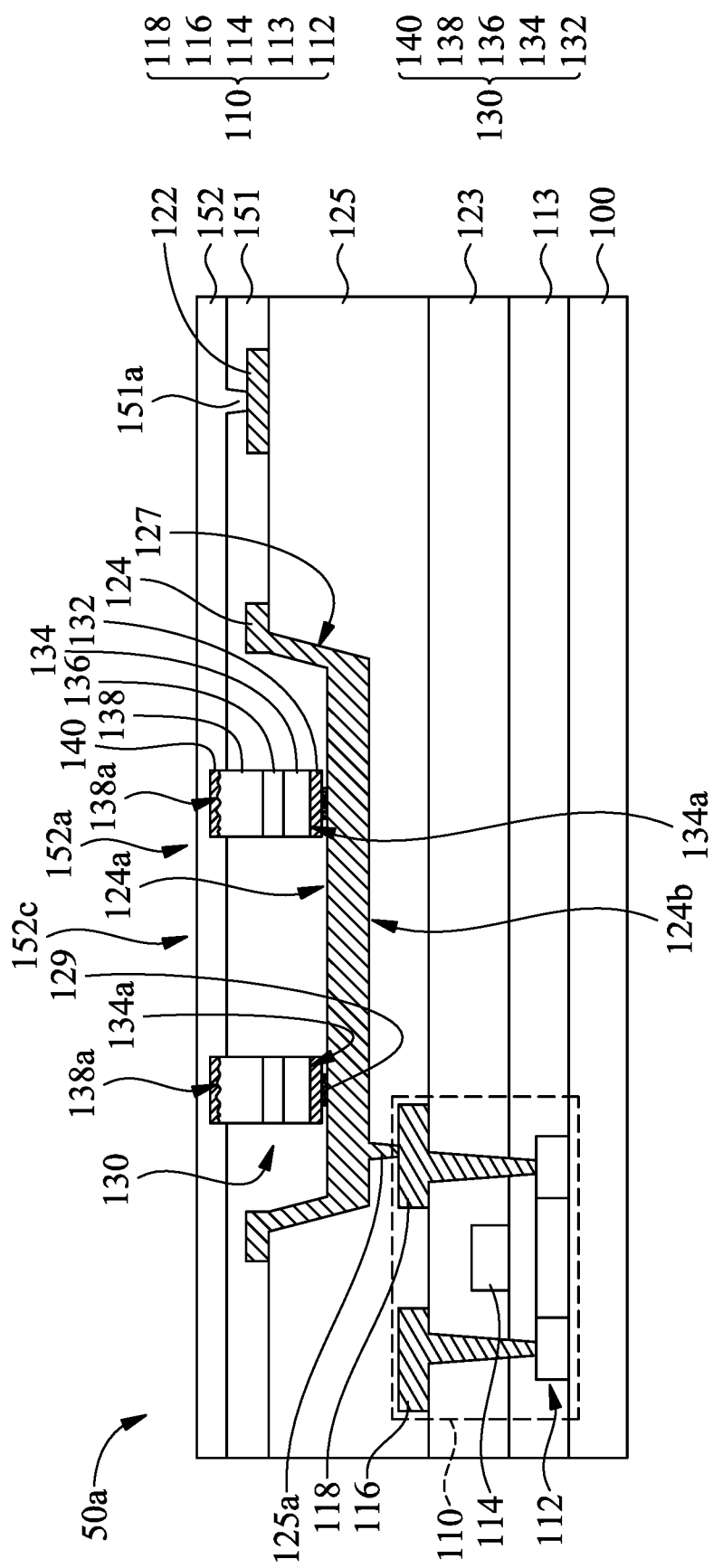

Refer to FIG. 6-1, in which a cross section of a display device 50 according to some embodiments of the present disclosure is shown. Elements in FIG. 6-1 that are the same as those in FIG. 2-1 are labeled with the same reference numbers as in FIG. 2-1 and may not be described again for brevity. In the embodiment, the structure of the display device 60 is similar to that of the display device 10 shown in FIG. 2-1, and therefore it may have the same advantages as display device 10. Unlike the structure of the display device 10 shown in FIG. 2-1, the first semiconductor layer 134 of the light emitting unit 130 has a surface 134a adjacent to the first electrode 132. Moreover, the second semiconductor layer 138 of the light emitting unit 130 has a surface 138a that is adjacent to the second electrode 140 and farthest from the first conductive layer 124. A roughness of the surface 138a is greater than a roughness of the surface 134a. As a result, the first surface 152a of the second conductive layer 152 and the underlying rough surface 138a of the second semiconductor layer 138 can increase the viewing angle of light emitted from the light emitting unit 130, thereby enhancing the viewing angle performance of the display device 50.

In some embodiments, the second electrode 140 of each light emitting unit 130 in the display device 50 may have a rough surface adjacent to the second conductive layer 152 and the first electrode 132 has a surface adjacent to the first conductive layer 124. The rough surface of the second electrode 140 and the surface of the first electrode 132 may be respectively the same as or similar to the surfaces 140a and 132a shown in FIG. 5-1 or 5-2. As a result, the first surface 152a of the second conductive layer 152, the rough surface of the second electrode 140, and the rough surface 138a of the second semiconductor layer 138 can increase the viewing angle of light emitted from the light emitting unit 130, thereby enhancing the viewing angle performance of the display device 50.

In some embodiments, the first conductive layer 124 of the display device 50 may have a top surface 124a that is the same as or similar to that shown in FIG. 3.

In some embodiments, similar to the display devices 30, 30a, 30b, and 30c shown in FIGS. 4-1, 4-2, 4-3, and 4-4, respectively, the display device 50 may further include a scattering layer 155 (as shown in FIGS. 4-1 and 4-2) disposed on the second conductive layer 152 on the light emitting units 130 or a scattering layer 165 (as shown in FIG. 4-3 or 4-4) disposed on the first conductive layer 124 and below the light emitting units 130.

Refer to FIG. 6-2, in which a cross section of a display device 50a according to some embodiments of the present disclosure is shown. Elements in FIG. 6-2 that are the same as those in FIG. 6-1 are labeled with the same reference numbers as in FIG. 6-1 and may not be described again for brevity. In the embodiment, the structure of the display device 50a is similar to that of the display device 50 shown in FIG. 6-1, and therefore it may have the same advantages as display device 50. Unlike the structure of the display device 50 shown in FIG. 6-1, the first electrode 132 of each light emitting unit 130 in the display device 50a is covered by a second conductive layer 152 having a substantially smooth surface 152c. Namely, the second conductive layer 152 in the display device 50a does not have the first surface 152a shown in FIG. 6-1.

In some embodiments, the second electrode 140 of each light emitting unit 130 in the display device 50a may have a rough surface adjacent to the second conductive layer 152 and the first electrode 132 has a surface adjacent to the first conductive layer 124. The rough surface of the second electrode 140 and the surface of the first electrode 132 may be respectively the same as or similar to the surfaces 140a and 132a shown in FIG. 5-1 or 5-2. As a result, the first surface 152a of the second conductive layer 152, the rough surface of the second electrode 140, and the rough surface 138a of the second semiconductor layer 138 can increase the viewing angle of light emitted from the light emitting unit 130, thereby enhancing the viewing angle performance of the display device 50a.

In some embodiments, the first conductive layer 124 of the display device 50a may have a top surface 124a that is the same as or similar to that shown in FIG. 3.

In some embodiments, the first electrode 132 of each light emitting unit 130 in the display device 50a is covered by a second conductive layer 152 without having the first surface 152a (as shown in FIG. 5-1). In those cases, similar to the display devices 30, 30a, 30b, and 30c shown in FIGS. 4-1, 4-2, 4-3, and 4-4, respectively, the display device 40a may further include a scattering layer 155 (as shown in FIGS. 4-1 and 4-2) disposed on the second conductive layer 152 on the light emitting units 130 or a scattering layer 165 (as shown in FIG. 4-3 or 4-4) disposed on the first conductive layer 124 and below the light emitting units 130.

According to the foregoing embodiments, since the second conductive layer has a rough surface corresponding to at least one of the light emitting units or the first conductive layer in the recess of the second insulating layer, from a top-view perspective, the viewing angle of light emitted from the light emitting unit below the rough surface of the second conductive layer can be increased, thereby providing better viewing angle performance.

Moreover, since the second conductive layer has a substantially smooth surface corresponding to a region outside of the first conductive layer from a top-view perspective, cracking of the second conductive layer near the conductive structure (which is electrically connected to the common line) can be eliminated or mitigated. As a result, a better electrical connection can be made between the second conductive layer and the common line, increasing the reliability of the display device.

According to the foregoing embodiments, since the first conductive layer has a rough top surface or is covered by a scattering layer having a rough surface, so that the light emitting unit is disposed between two opposing rough surfaces. As a result, the viewing angle performance of the display device can be enhanced further.

According to the foregoing embodiments, since the second conductive layer is covered by a scattering layer having a rough surface that corresponds to the first conductive layer in the recess of the second insulating layer, from a top-view perspective, the viewing angle performance of the display device can be enhanced further.

According to the foregoing embodiments, since the second electrode and/or the second semiconductor layer of the light emitting unit have rough top surfaces, from a top-view perspective, the viewing angle performance of the display device can be enhanced further.

While the disclosure has been described by way of example and in terms of the preferred embodiments, it should be understood that the disclosure is not limited to the disclosed embodiments. On the contrary, it is intended to overlap various modifications and similar arrangements (as would be apparent to those skilled in the art). Therefore, the scope of the appended claims should be accorded the broadest interpretation so as to encompass all such modifications and similar arrangements.

What is claimed is:

1. A display device, comprising:
   a substrate;
   an insulating layer disposed on the substrate and having a recess;
   an organic layer disposed on the insulating layer;
   at least one light emitting unit disposed in the recess; and
   a conductive layer disposed on the at least one light emitting unit, wherein the organic layer comprises scattering particles therein.

2. The display device according to claim 1, wherein the at least one light emitting unit is disposed on the organic layer.

3. The display device according to claim 2, wherein the organic layer is disposed in the recess.

4. The display device according to claim 2, wherein the organic layer is in direct contact with sidewalls of the at least one light emitting unit.

5. The display device according to claim 1, wherein the at least one light emitting unit protrudes from the recess.

6. The display device according to claim 5, wherein the at least one light emitting unit is exposed from the organic layer.

7. The display device according to claim 1, wherein a top surface of the organic layer is higher than a top surface of the insulating layer.

8. The display device according to claim 1, wherein the organic layer comprises polyimide, acrylate, epoxy, poly (methyl methacrylate), benzocyclobutene or polyester.

9. The display device according to claim 1, wherein the scattering particles comprise quantum dots transparent particles.

10. The display device according to claim 1, wherein the scattering particles comprise transparent particles.

11. The display device according to claim 1, wherein the conductive layer is electrically connected to the at least one light emitting unit.

12. The display device according to claim 11, further comprising a common line disposed on the insulating layer and electrically connected to the conductive layer.

13. The display device according to claim 11, wherein a roughness of a top surface of the organic layer is greater than a roughness of a top surface of the conductive layer.

14. The display device according to claim 1, wherein the at least one light emitting unit comprises an electrode, and a roughness of a top surface of the organic layer is greater than a roughness of a top surface of the electrode of the at least one light emitting unit.

15. The display device according to claim 1, wherein the organic layer has a rough surface.

16. The display device according to claim 15, wherein the rough surface comprises a plurality of protrusions thereon.

* * * * *